United States Patent
Chang et al.

(10) Patent No.: US 7,942,999 B2
(45) Date of Patent: May 17, 2011

(54) FABRICATION METHOD OF RIGID-FLEX CIRCUIT BOARD

(75) Inventors: Chih-Ming Chang, Taoyuan County (TW); Hsin-En Chung, Yunlin County (TW); Yu-Feng Tseng, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 305 days.

(21) Appl. No.: 12/196,868

(22) Filed: Aug. 22, 2008

(65) Prior Publication Data
US 2010/0043962 A1   Feb. 25, 2010

(51) Int. Cl.
B32B 37/00    (2006.01)
B32B 37/06    (2006.01)

(52) U.S. Cl. .......... 156/272.8; 29/825; 216/13; 156/247

(58) Field of Classification Search ................ 156/272.8
See application file for complete search history.

(56) References Cited

U.S. PATENT DOCUMENTS

| | | | | |
|---|---|---|---|---|
| 5,047,279 A * | 9/1991 | Nasu et al. | | 428/156 |
| 6,344,974 B1 * | 2/2002 | Hirata et al. | | 361/760 |
| 6,426,011 B1 * | 7/2002 | Katoh | | 216/19 |
| 6,468,439 B1 * | 10/2002 | Whitehurst et al. | | 216/95 |
| 2009/0026168 A1 * | 1/2009 | Tsai et al. | | 216/17 |

FOREIGN PATENT DOCUMENTS

| | | | |
|---|---|---|---|
| CN | 1304535 | * | 7/2001 |
| CN | 1799289 | | 7/2006 |
| JP | 2006173252 | | 6/2006 |
| JP | 2006173252 A | * | 6/2006 |
| TW | 515056 | | 12/2002 |
| TW | M302222 | | 12/2006 |
| TW | I287957 | | 10/2007 |

OTHER PUBLICATIONS

Chinese First Examination Report of China Application No. 200810125673.4, dated Jul. 27, 2010.

* cited by examiner

*Primary Examiner* — Philip C Tucker
*Assistant Examiner* — Vicki Wu
(74) *Attorney, Agent, or Firm* — J.C. Patents

(57) ABSTRACT

A fabrication method of a rigid-flex circuit board is described as follows. Firstly, a flexible circuit board and at least a cover layer are provided. The cover layer covers a surface of the flexible circuit board. A protection layer is then formed on the cover layer. Next, a substrate is laminated to the surface of the flexible circuit board. The substrate has a conductive layer and a prepreg disposed between the conductive layer and the cover layer. The prepreg has an opening for accommodating the protection layer. Thereafter, the conductive layer is patterned for forming a patterned conductive layer. Afterwards, the protection layer is removed.

14 Claims, 7 Drawing Sheets

FABRICATION METHOD OF RIGID-FLEX CIRCUIT BOARD

BACKGROUND OF THE INVENTION

1. Field of the Invention

The present invention relates to a fabrication method of a circuit substrate. More particularly, the present invention relates to a fabrication method of a rigid-flex circuit board.

2. Description of Related Art

A rigid-flex circuit board is a printed circuit board comprised of a flexible circuit board and a rigid circuit board, and therefore the rigid-flex circuit board is characterized by flexibility of the flexible circuit board and rigidity of the rigid circuit board. When the rigid-flex circuit board is fabricated, the flexible circuit board containing intrinsic circuits serves as a core layer, and circuits in the rigid circuit board are formed on the flexible circuit board by performing a build-up process or a lamination process. A flexible portion of the flexible circuit board is exposed by a gap of the rigid circuit board, and a routing process is then performed by a cutting machine, so as to form the required number of rigid-flex circuit boards with a designated shape.

FIG. 1 is a schematic cross-sectional view of a conventional rigid-flex circuit board. In FIG. 1, a substrate 110 is bonded to a flexible circuit board 130 through a cover layer 120 for forming a rigid-flex circuit board 100. The substrate 110 has a prepreg 112 and a patterned conductive layer 114 disposed on the prepreg 112. The flexible circuit board 130 has a flexible portion F exposed by an opening OP1 of the prepreg 112, such that the rigid-flex circuit board 100 equipped with the flexible portion F is characterized by flexibility.

According to the pertinent art, when the prepreg 112 is laminated to the flexible circuit board 130, the prepreg 112 is prone to be distorted, such that a portion of squeeze 116 overflows into the opening OP1 and partially covers the flexible portion F of the flexible circuit board 130. However, as the flexible portion F is partially covered by the squeeze 116, the flexibility of the rigid-flex circuit board 100 is significantly reduced. In addition, the squeeze 116 covering the flexible portion F is not apt to be removed, and it is thus likely for the squeeze to remain, which may pose an impact on yield in subsequent manufacturing processes.

SUMMARY OF THE INVENTION

The present invention is directed to a fabrication method of a rigid-flex circuit board for resolving a conventional issue in connection with effectively removing a squeeze that covers a flexible portion.

To embody the present invention, a fabrication method of a rigid-flex circuit board is provided and elaborated hereinafter. Firstly, a flexible circuit board and at least a cover layer are provided. The cover layer covers a surface of the flexible circuit board. A protection layer is then formed on the cover layer. Next, a substrate is laminated to the surface of the flexible circuit board. The substrate has a conductive layer and a prepreg that is disposed between the conductive layer and the cover layer. The prepreg has an opening for accommodating the protection layer. Thereafter, the conductive layer is patterned for forming a patterned conductive layer. Afterwards, the protection layer is removed.

In an embodiment of the present invention, the prepreg is a non-flow prepreg.

In an embodiment of the present invention, a material of the protection layer includes viscous materials and resin.

In an embodiment of the present invention, the material of the protection layer includes polyimide (PI) and acrylic.

In an embodiment of the present invention, a material of the protection layer includes metals or an alloy thereof.

In an embodiment of the present invention, a method of removing the protection layer includes a stripping method.

In an embodiment of the present invention, the fabrication method of the rigid-flex circuit board further includes heating the substrate after the substrate is laminated to the flexible circuit board, so as to cure the prepreg.

To embody the present invention, a fabrication method of a rigid-flex circuit board is further provided and elaborated hereinafter. Firstly, a flexible circuit board and at least a cover layer are provided. The cover layer covers a surface of the flexible circuit board. A protection layer is then formed on the cover layer. Next, a substrate is laminated to the surface of the flexible circuit board. The substrate has a conductive layer and a prepreg that is disposed between the conductive layer and the cover layer. The prepreg covers the protection layer. Thereafter, the conductive layer is patterned for forming a patterned conductive layer. The protection layer and the prepreg disposed on the protection layer are then removed.

In an embodiment of the present invention, a material of the protection layer includes viscous materials and resin.

In an embodiment of the present invention, the material of the protection layer includes PI and acrylic.

In an embodiment of the present invention, a material of the protection layer includes metals or an alloy thereof.

In an embodiment of the present invention, a method of removing the protection layer and the prepreg disposed on the protection layer includes forming a trench pattern on the prepreg through performing a laser cutting process or a mechanical cutting process and then removing the protection layer and the prepreg disposed on the protection layer by performing a stripping method.

In an embodiment of the present invention, the mechanical cutting process includes a V-cut process.

In an embodiment of the present invention, the fabrication method of the rigid-flex circuit board further includes heating the substrate after the substrate is laminated to the flexible circuit board, so as to cure the prepreg.

In view of the above, the fabrication method of the rigid-flex circuit board according to the present invention is applied by first covering the flexible portion of the flexible circuit board with use of the protection layer and then laminating the substrate to the flexible circuit board. Thereby, during the removal of the protection layer, the squeeze or the prepreg disposed on the protection layer can also be removed simultaneously, and the flexible portion is then exposed. As such, conventional difficulties in removing the squeeze that covers the flexible portion can be overcome according to the present invention.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 2A through 2E are schematic cross-sectional flowcharts illustrating a fabrication method of a rigid-flex circuit board according to an embodiment of the present invention.

Figure 1:
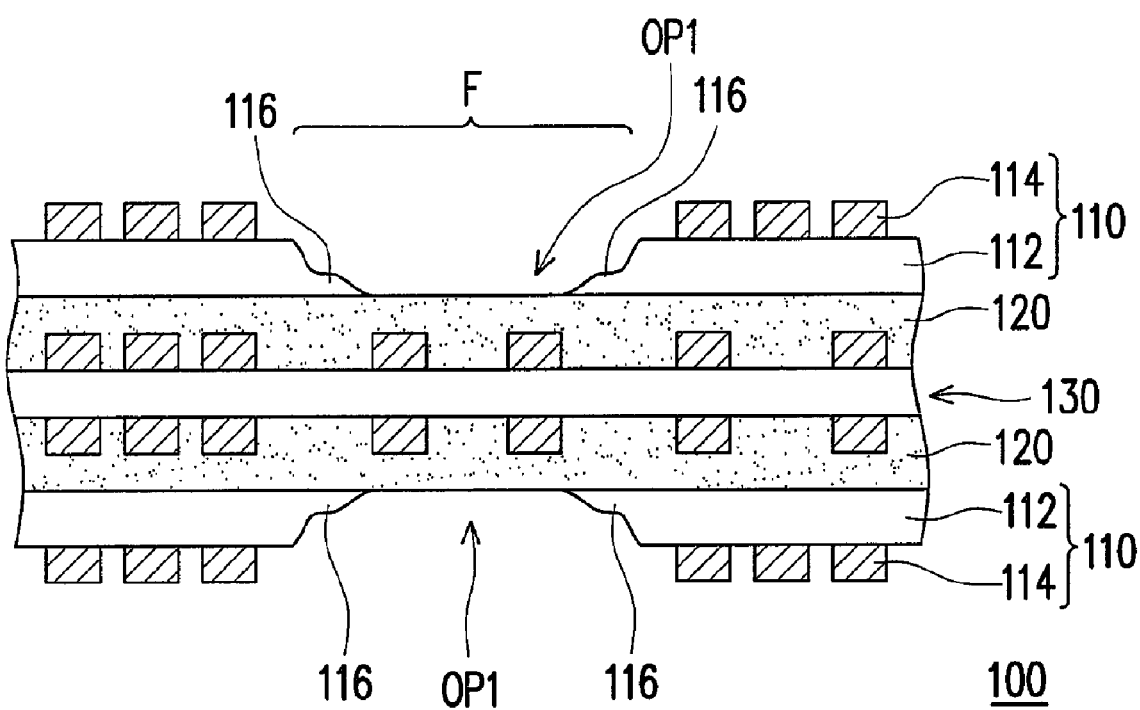
FIG. 1 is a schematic cross-sectional view of a conventional rigid-flex circuit board.
Figure 2A:
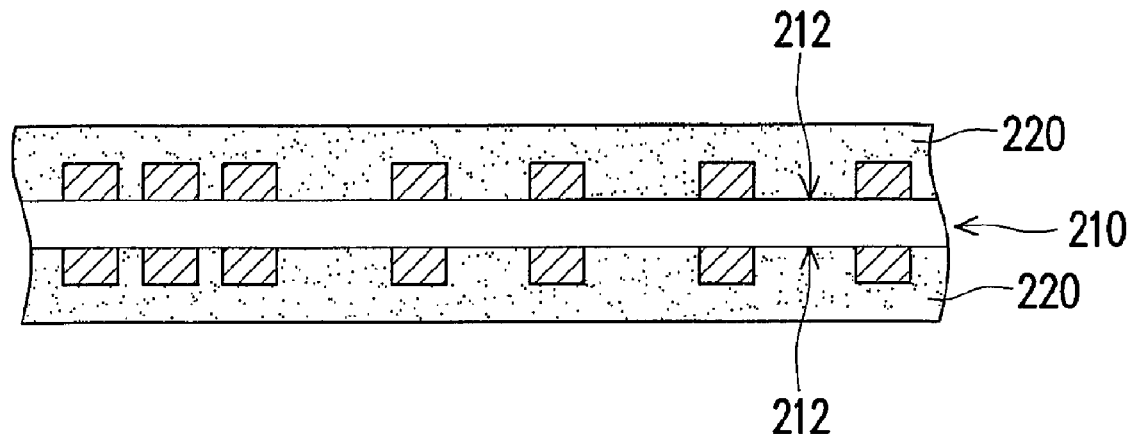
FIGS. 2A through 2E are schematic cross-sectional flowcharts illustrating a fabrication method of a rigid-flex circuit board according to an embodiment of the present invention.

First, referring to FIG. 2A, a flexible circuit board 210 and at least a cover layer 220 are provided. The flexible circuit board 210 can be a single-layer circuit board or a double-layer circuit board, and thereby the cover layer 220 can optionally cover one surface or two surfaces of the flexible circuit board 210.

In the present embodiment, two cover layers 220 respectively covering two surfaces 212 of the flexible circuit board 210 are taken to exemplify the present invention. Since people skilled in the pertinent art are able to embody the present invention by utilizing one cover layer 220 in the same manner depicted in FIG. 2A, relevant descriptions are omitted herein. The cover layer 220 can be made of PI, polyethylene terephthalate (PET), or other polymer materials characterized by flexibility.

Figure 2B:
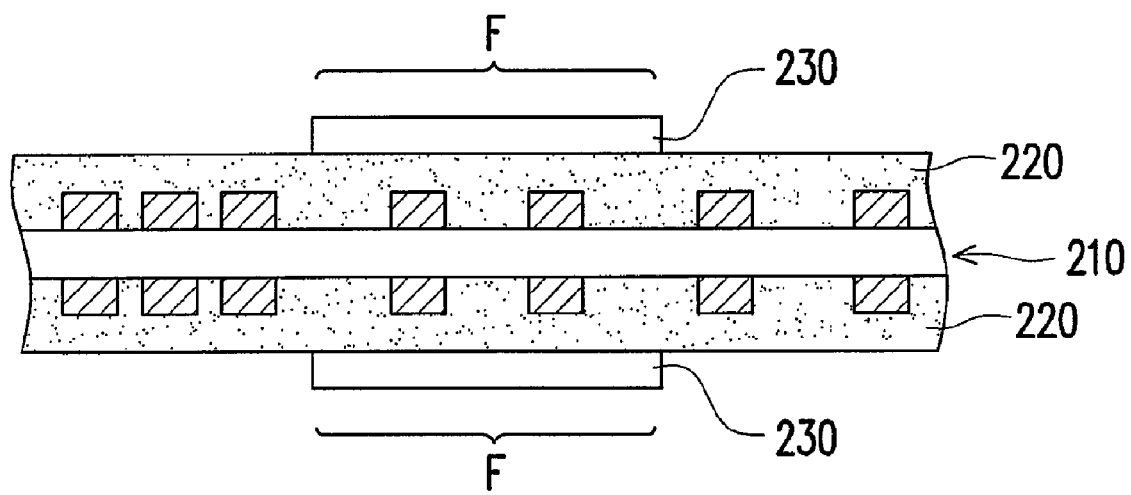

Next, referring to FIG. 2B, a protection layer 230 is formed on each of the two cover layers 220, respectively, and the protection layer 230 is formed on a flexible portion F of the flexible circuit board 210. People skilled in the pertinent art are able to deduce from FIG. 2B that the number of the flexible portion F is singular or plural. In the present embodiment, only one flexible portion F is taken to exemplify the present invention, which is however not limited herein.

The protection layer 230 can be made of viscous materials and resin. For instance, the protection layer 230 is made of PI and acrylic. In addition, the protection layer 230 is capable of preventing the underlying cover layer 220 from being etched by chemicals, such as acid and alkaline solutions. The viscous material constituting the protection layer 230 can be water-soluble acrylic or latex that features low viscosity and excellent separability. The protection layer 230 can also be made of metals, an alloy thereof, or other heat-resistant and chemical-resistant materials.

Figure 2C:
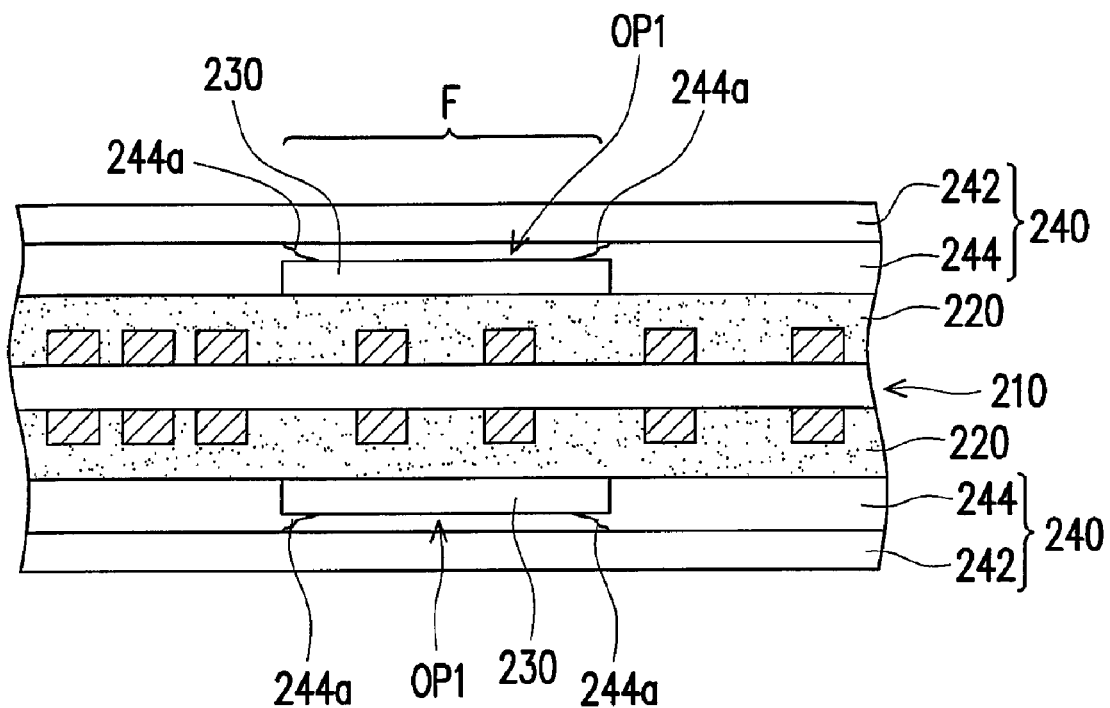

After that, referring to FIG. 2C, at least a substrate 240 is laminated to the surface of the cover layers 220. The substrate 240 has a conductive layer 242 and a prepreg 244 that is disposed between the conductive layer 242 and the cover layer 220. The prepreg 244 has at least an opening OP1 for exposing the protection layer 230. In the present embodiment, the prepreg 244 is a non-flow prepreg with a viscosity coefficient ranging from 8000 poise to 24000 poise. The protection layer 230 is disposed within the opening OP1 of the prepreg 244. Next, after the substrate 240 is laminated to the flexible circuit board 210, the prepreg 244 is lastingly baked by a heating furnace, such that the prepreg 244 is thermal-bonded and is then transformed into a solid state.

Note that when the substrate 240 is laminated to the flexible circuit board 210 according to the present embodiment, the prepreg 244 of the substrate 240 is compressed and distorted, such that a part of a squeeze 244a of the prepreg 244 overflows into the opening OP1 and partially covers the protection layer 230.

Figure 2D:
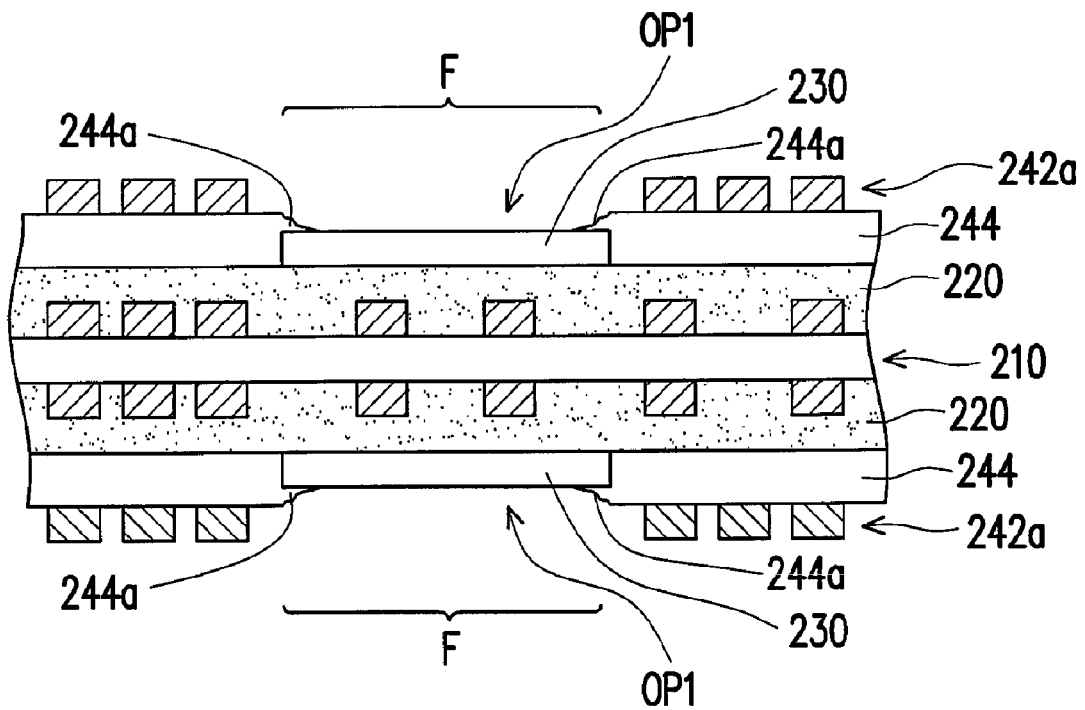

After that, referring to FIG. 2D, the conductive layer 242 is patterned for forming at least a patterned conductive layer 242a that exposes the protection layer 230. Here, the conductive layer 242 is patterned by wet etching or dry etching.

In the present embodiment, the protection layer 230 covers the flexible portion F when the conductive layer 242 is patterned, and therefore the protection layer 230 is able to protect the flexible portion F from being affected by wet etching or dry etching. Besides, in other embodiments, the protection layer 230 can protect the flexible portion F from being affected by wet etching, dry etching, subsequent processes of laminating other substrates (not shown) to the substrate 240 of the present embodiment, or other processes (e.g. electroplating, cleansing, and so on).

Figure 2E:
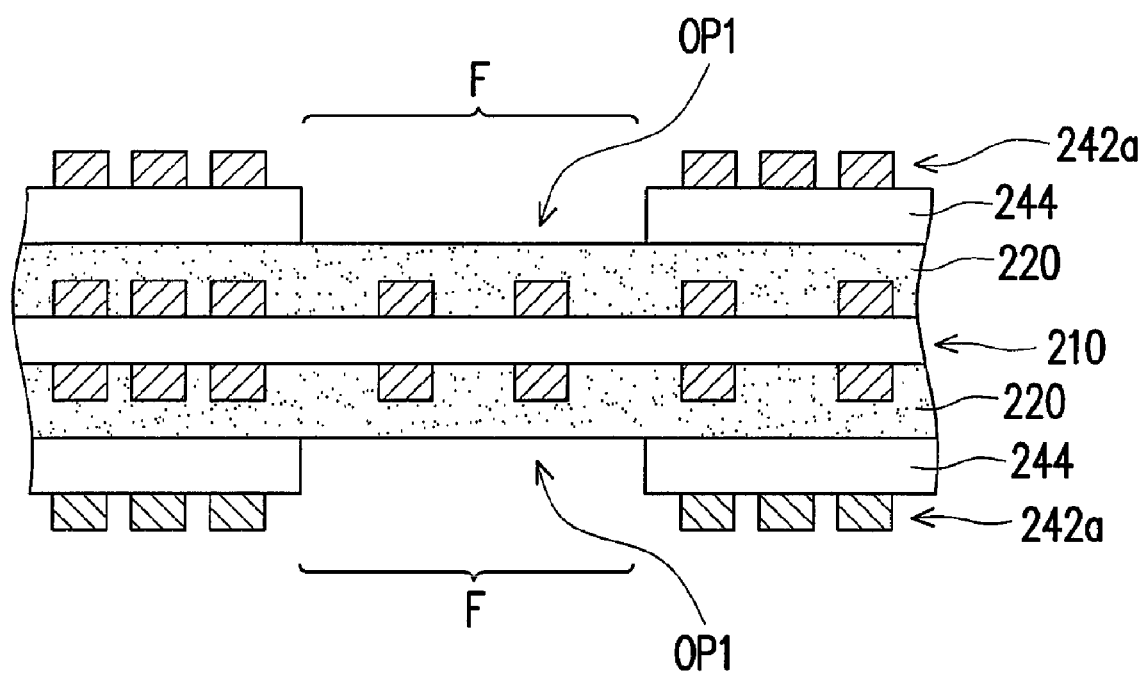

Next, as shown in FIG. 2E, the protection layer 230 is removed. A method of removing the protection layer 230 includes performing a stripping method. Here, the striping process is, for example, implemented by using cutting tools. Note that the part of the squeeze 244a of the prepreg 244 covers a portion of the protection layer 230 when the substrate 240 is laminated to the flexible circuit board 210. Hence, during the removal of the protection layer 230, the squeeze 244a covering the protection layer 230 can be simultaneously removed. As such, the disposition of the flexible portion F according to the present embodiment can overcome conventional difficulties in removing the hardly removable squeeze that covers the flexible portion, thus improving yield in the subsequent processes.

FIGS. 3A through 3F are schematic cross-sectional flowcharts illustrating a fabrication method of a rigid-flex circuit board according to another embodiment of the present invention. First, referring to FIG. 3A, a flexible circuit board 210 and at least a cover layer 220 are provided. In the present embodiment, a material of the flexible circuit board 210, a material of the cover layer 220, and the arrangement of the flexible circuit board 210 and the cover layer 220 are the same as those depicted in FIG. 2A, and thus no further description is provided herein.

Figure 3A:
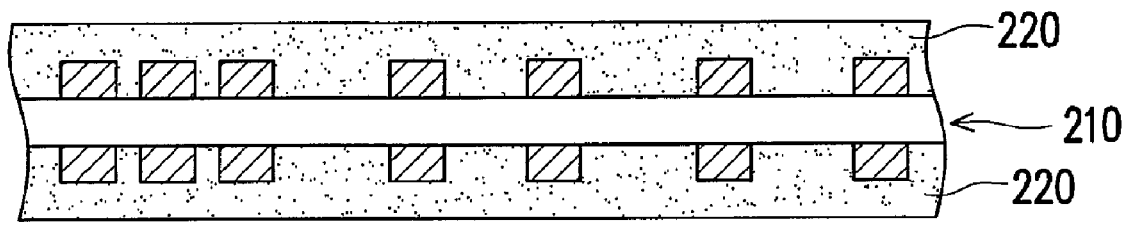
FIGS. 3A through 3F are schematic cross-sectional flowcharts illustrating a fabrication method of a rigid-flex circuit board according to another embodiment of the present invention.
Figure 3B:
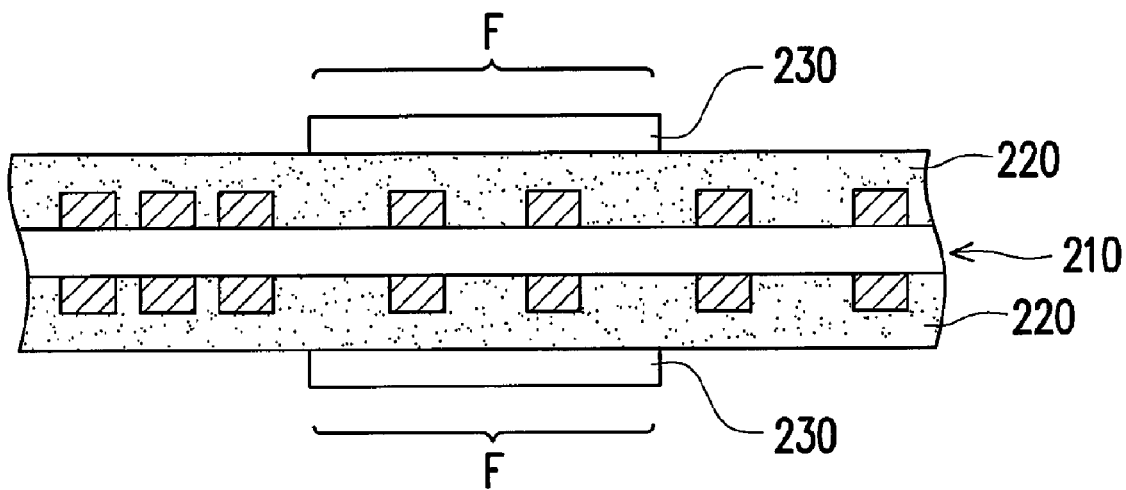

Next, referring to FIG. 3B, one protection layer 230 is formed on each of the two cover layers 220, respectively. In addition, the protection layer 230 is formed on the flexible portion F of the flexible circuit board 210. People skilled in the pertinent art are able to deduce from FIG. 3B that the number of the flexible portion F is singular or plural. In the present embodiment, only one flexible portion F is taken to exemplify the present invention, which is however not limited herein. A material of the protection layer 230 in the present embodiment is the same as the material of the protection layer 230 depicted in FIG. 2B, and thus no further description is provided herein.

Figure 3C:
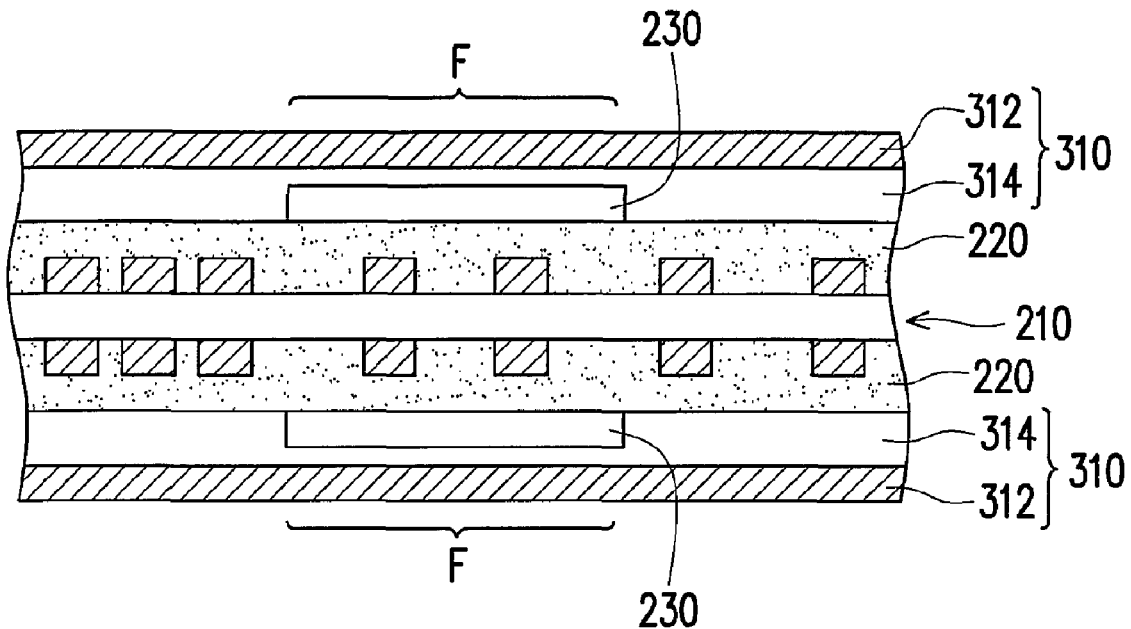

After that, referring to FIG. 3C, at least a substrate 310 is laminated to the surface of the cover layers 220. The substrate 310 has a conductive layer 312 and a prepreg 314 that is disposed between the conductive layer 312 and the cover layer 220. Besides, the prepreg 314 covers the protection layer 230. Next, the substrate 310 is heated after the substrate 310 is laminated to the flexible circuit board 210, so as to cure the prepreg 314.

It should be mentioned that the prepreg 314 of the present embodiment is a prepreg with a viscosity coefficient ranging from 500 poise to 1000 poise. Therefore, after the substrate 310 is laminated to the flexible circuit board 210, the prepreg 314 would cover the protection layer 230. As such, a difference between the prepreg 314 of the present embodiment and the prepreg 244 depicted in FIG. 2C lies in that the prepreg 244 has the opening OP1 after the substrate 240 is laminated to the flexible circuit board 210, while the prepreg 314 is not equipped with the opening.

Figure 3D:
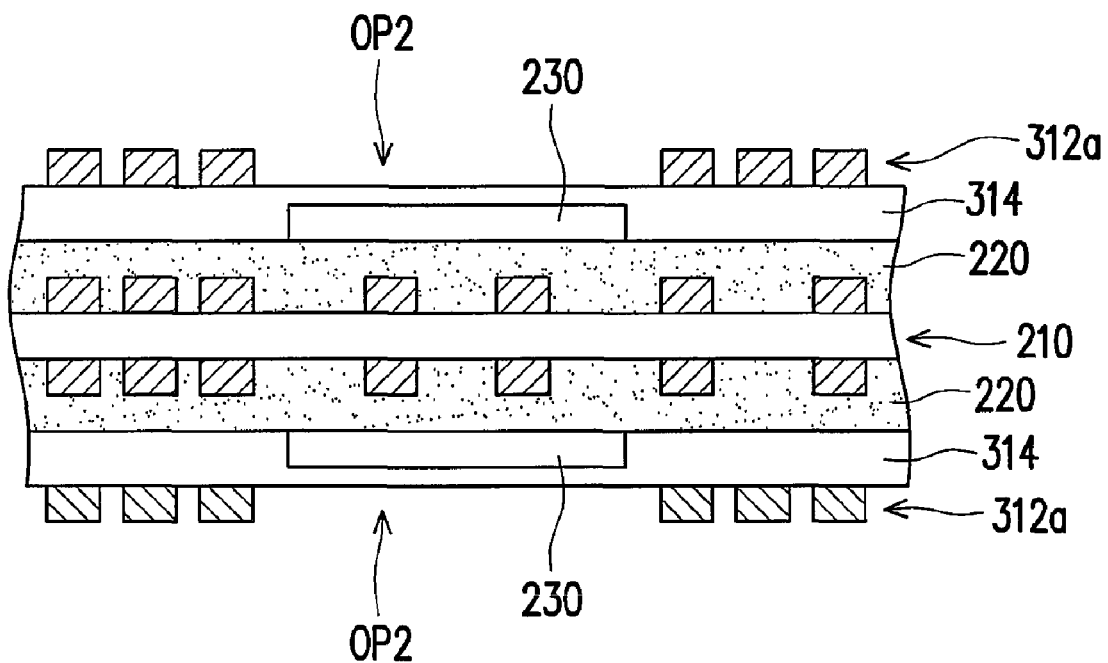

Thereafter, as shown in FIG. 3D, the conductive layer 312 is patterned for forming at least a patterned conductive layer 312a. The patterned conductive layer 312a has at least an opening OP2 that is corresponding to the flexible portion F. Here, the conductive layer 312 is patterned by wet etching or dry etching.

Figure 3E:
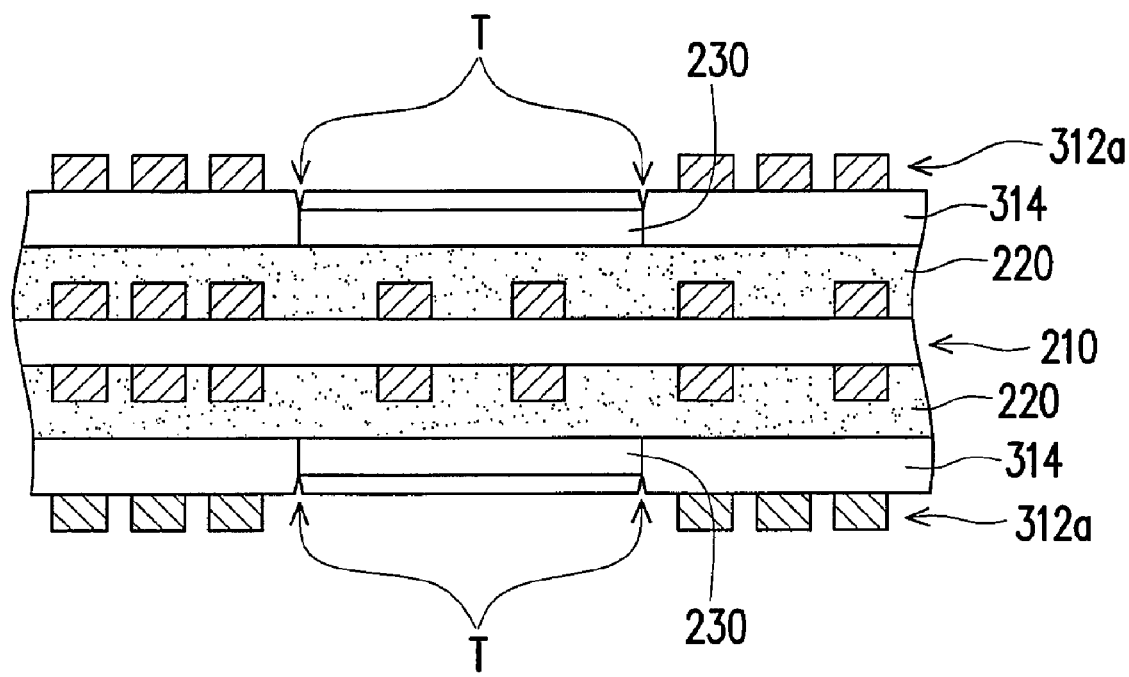

After that, referring to FIG. 3E, the protection layer 230 and the prepreg 314 disposed on the protection layer 230 are removed by first forming a trench pattern T on the prepreg 314 through performing a laser cutting process or a mechanical cutting process, for example, and the protection layer 230 and the prepreg 314 disposed on the protection layer 230 are then removed by performing a stripping method. The mechanical cutting process includes a V-cut process, for example, and the stripping method is, for example, implemented by removing the protection layer 230 and the prepreg 314 disposed on the protection layer 230 with use of cutting tools. According to the present embodiment, the trench pattern T is substantially located at peripheral regions of the protection layer 230.

Figure 3F:
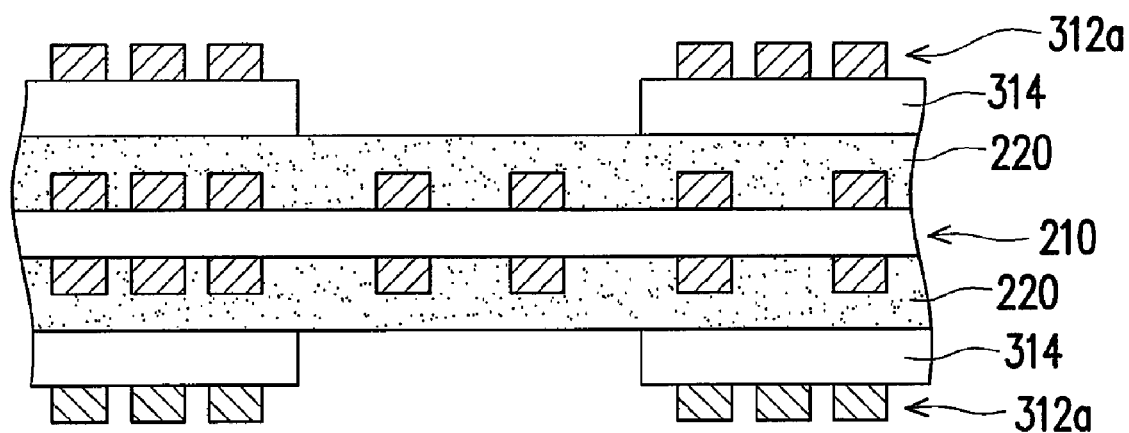

Next, as shown in FIG. 3F, the protection layer 230 and the prepreg 314 disposed on the protection layer 230 are removed, so as to form a rigid-flex circuit board 300. In comparison with the conventional flexible portion which may have residual squeeze that cannot be removed with ease, the prepreg 314 disposed above the flexible portion F can be removed together with the removal of the protection layer 230 according to the present embodiment, and therefore yield in the subsequent processes can be improved.

In view of the above, the fabrication method of the rigid-flex circuit board according to the present invention is applied by first covering the flexible portion of the flexible circuit board with use of the protection layer and then laminating the substrate to the flexible circuit board. As such, when the substrate is laminated to the flexible circuit board, the squeeze formed by compressing the prepreg of the substrate covers the protection layer and does not adhere to the flexible portion. Moreover, during the removal of the protection layer, the squeeze on the protection layer can be simultaneously removed, and thus yield in the subsequent processes can be further improved. Besides, the protection layer can protect the flexible portion from being affected by wet etching, dry etching, subsequent processes of laminating other substrates to the substrate of the present invention, or other processes (e.g. electroplating, cleansing, and so on).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a rigid-flex circuit board, the fabrication method comprising:
    providing a flexible circuit board and at least a cover layer, wherein the cover layer covers a surface of the flexible circuit board;
    forming a protection layer on the cover layer, wherein the protection layer is only located on a flexible portion of the flexible circuit board;
    laminating a substrate to the surface of the flexible circuit board, wherein the substrate has a conductive layer and a prepreg that is disposed between the conductive layer and the cover layer, and the prepreg has an opening which exposes the protection layer;
    patterning the conductive layer for forming a patterned conductive layer; and
    removing the protection layer completely.

2. The fabrication method of the rigid-flex circuit board as claimed in claim 1, wherein the prepreg is a non-flow prepreg.

3. The fabrication method of the rigid-flex circuit board as claimed in claim 1, wherein a material of the protection layer comprises viscous materials and resin.

4. The fabrication method of the rigid-flex circuit board as claimed in claim 3, wherein the material of the protection layer comprises polyimide (PI) and acrylic.

5. The fabrication method of the rigid-flex circuit board as claimed in claim 1, wherein a material of the protection layer comprises metals or an alloy thereof.

6. The fabrication method of the rigid-flex circuit board as claimed in claim 1, wherein a method of removing the protection layer comprises a stripping method.

7. The fabrication method of the rigid-flex circuit board as claimed in claim 1, further comprising heating the substrate after the substrate is laminated to the flexible circuit board, so as to cure the prepreg.

8. A fabrication method of a rigid-flex circuit board, the fabrication method comprising:
    providing a flexible circuit board and at least a cover layer, wherein the cover layer covers a surface of the flexible circuit board;
    forming a protection layer on the cover layer, wherein the protection layer is only located on a flexible portion of the flexible circuit board;
    laminating a substrate to the surface of the flexible circuit board, wherein the substrate has a conductive layer and a prepreg that is disposed between the conductive layer and the cover layer, and the prepreg covers the protection layer;
    patterning the conductive layer for forming a patterned conductive layer; and
    removing the protection layer completely and removing the prepreg disposed on the protection layer.

9. The fabrication method of the rigid-flex circuit board as claimed in claim 8, wherein a material of the protection layer comprises viscous materials and resin.

10. The fabrication method of the rigid-flex circuit board as claimed in claim 9, wherein the material of the protection layer comprises polyimide (PI) and acrylic.

11. The fabrication method of the rigid-flex circuit board as claimed in claim 8, wherein a material of the protection layer comprises metals or an alloy thereof.

12. The fabrication method of the rigid-flex circuit board as claimed in claim 8, wherein a method of removing the protection layer and the prepreg disposed on the protection layer comprises:
    forming a trench pattern on the prepreg through performing a laser cutting process or a mechanical cutting process; and
    removing the protection layer and the prepreg disposed on the protection layer by performing a stripping method.

13. The fabrication method of the rigid-flex circuit board as claimed in claim 12, wherein the mechanical cutting process comprises a V-cut process.

14. The fabrication method of the rigid-flex circuit board as claimed in claim 8, further comprising heating the substrate after the substrate is laminated to the flexible circuit board, so as to cure the prepreg.

* * * * *